United States Patent
Gomes-Monteiro

(10) Patent No.: US 12,329,242 B2
(45) Date of Patent: Jun. 17, 2025

(54) MS ROLON

(71) Applicant: Maria L Gomes-Andrade, Randolph, MA (US)

(72) Inventor: Jovanny Ivan Gomes-Monteiro, Randolph, MA (US)

( * ) Notice: Subject to any disclaimer, the term of this patent is extended or adjusted under 35 U.S.C. 154(b) by 336 days.

(21) Appl. No.: 18/096,547

(22) Filed: Jan. 12, 2023

(65) Prior Publication Data
US 2023/0248107 A1    Aug. 10, 2023

Related U.S. Application Data

(63) Continuation-in-part of application No. 16/683,247, filed on Nov. 13, 2019, now abandoned.

(51) Int. Cl.
    *A43B 7/26* (2006.01)
    *A43B 7/1455* (2022.01)
    *H05K 7/14* (2006.01)

(52) U.S. Cl.
    CPC .............. *A43B 7/146* (2013.01); *A43B 7/26* (2013.01); *H05K 7/1427* (2013.01)

(58) Field of Classification Search
    CPC ......... A43B 7/26; A43B 7/146; H05K 7/1427
    See application file for complete search history.

(56) References Cited

U.S. PATENT DOCUMENTS

| | | | | |
|---|---|---|---|---|
| 2,506,308 A * | 5/1950 | Maynier | ............... | A45D 29/22 132/73 |
| 2,751,693 A * | 6/1956 | Baker | ............... | A43B 7/26 132/73 |
| 2,808,662 A * | 10/1957 | Webb | ............... | A43B 3/126 36/94 |
| 4,017,987 A * | 4/1977 | Perez, Jr. | ............... | A43B 3/105 36/94 |
| 4,207,880 A * | 6/1980 | Zinkovich | ............... | A43B 7/26 36/94 |
| 5,322,056 A * | 6/1994 | Menghi | ............... | A43B 13/40 601/134 |
| 5,735,804 A * | 4/1998 | Chan | ............... | A61F 5/14 601/134 |
| 5,827,596 A * | 10/1998 | Donohue | ............... | D04H 11/00 428/95 |
| 5,946,823 A * | 9/1999 | Yates | ............... | A43B 7/085 36/94 |
| D591,937 S * | 5/2009 | Frederiksen | ............... | D2/919 |
| 7,614,168 B1 * | 11/2009 | Zummer | ............... | A61H 15/0078 601/126 |
| 7,980,005 B1 * | 7/2011 | Young | ............... | A43B 3/10 36/94 |
| 8,002,675 B2 * | 8/2011 | Ferri | ............... | A63B 24/00 482/79 |
| 2002/0184791 A1 * | 12/2002 | Ko | ............... | A43B 7/146 36/141 |

(Continued)

*Primary Examiner* — Katharine G Kane

(57) ABSTRACT

The application provides for a toe massage slipper that resembles a common shoe. This motion toe massage slipper has number of piks and nano piks combinations within the sole of the slipper. The toe massage slipper will be equipped with power source so the entire device can operate. This will enable the user to enjoy the benefits of receiving a toe massage while on the go. The toe massage slipper is also equipped with a power switch, such that when the motors are not in use, the device operates as a functional slipper and the piks are removable.

11 Claims, 4 Drawing Sheets

(56) References Cited

U.S. PATENT DOCUMENTS

| | | | |
|---|---|---|---|
| 2004/0093766 A1* | 5/2004 | Hahn | A43B 1/0045 36/3 R |
| 2004/0118015 A1* | 6/2004 | Lai | A43B 5/08 36/141 |
| 2006/0243291 A1* | 11/2006 | Daley | A45D 29/22 132/73 |
| 2007/0011915 A1* | 1/2007 | Allen | A43B 1/0081 36/94 |
| 2007/0017126 A1* | 1/2007 | Kipnes | A43B 3/24 36/94 |
| 2008/0086918 A1* | 4/2008 | Chung | A61F 5/14 36/141 |
| 2008/0161734 A1* | 7/2008 | Blockton | A61H 23/0263 36/141 |
| 2010/0251569 A1* | 10/2010 | Stern | A43B 3/103 36/94 |
| 2010/0263237 A1* | 10/2010 | Cuellar | A43B 3/24 132/73 |
| 2012/0030866 A1* | 2/2012 | Snider-Tornetta | A43B 7/085 2/455 |
| 2015/0096203 A1* | 4/2015 | Brown | A43B 7/146 36/136 |
| 2015/0374094 A1* | 12/2015 | Gift | A43B 23/081 36/94 |
| 2016/0361230 A1* | 12/2016 | Zahrieh | A43B 1/0054 |
| 2017/0196300 A1* | 7/2017 | Huang | A61H 23/006 |
| 2019/0029389 A1* | 1/2019 | Levy | A43B 3/12 |
| 2019/0246746 A1* | 8/2019 | Bock | A43C 11/20 |
| 2020/0345184 A1* | 11/2020 | Carter | A43B 3/108 |
| 2021/0022434 A1* | 1/2021 | Fulton | A43B 3/12 |

* cited by examiner

MS ROLON

SUMMARY OF THE INVENTION

Generally, the present invention is a toe massage slipper incorporating reflexology to a toe. The toe massage slipper has a sole with a circuit board unit that induces motion into a metal washer pivot piks to move and spin 360 degree. The circuit board unit transmits power mechanically from the heel area throughout the insole of the front slipper; the motion piks give power to nano piks for relaxation of the toes and a pleasant feeling to a person. The sole of the slipper has a port for cell battery slot, a switch portion to control the motion. The sole has a latch upon a door to place or remove the battery from a compartment in the heel side area of the sole. The switch is protected by elastomeric covers to prevent contamination by moisture and dirt. The toe massage slipper operates while the switch is on. The piks are removable so the slipper can be wear as a regular slipper. The present invention also includes an opening in the front with a flap for easy access to the toes; the flap can be used open or close. The invention is capable of other embodiments and of being practiced and carried out in various ways. The phraseology and terminology employed herein are for the purpose of description and should not be regarded as limiting. These together with other objects of the invention, along with the various features of novelty that characterize the invention, are pointed out with particularity in the claims annexed to and forming a part of this disclosure. For a better understanding of the invention, its operating advantages, and the specific objects attained by its uses; the reference should be accompanied by the drawings and descriptive matter in which there is an illustrated preferred embodiment of the invention.

DESCRIPTION OF THE PREFERRED EMBODIMENT

The present invention of the toe massage slipper is comprised of a circuit board that is installed in the sole of the slipper transmitter, mechanically powered electrically to the metal washer affixed to the bottom of piks and nano piks in the front central of the slipper give motion to piks unit. The present invention seeks to provide relaxation by using the device beginning with FIG. 1 Generally is a slipper 2, thickness sole with piks attached to the front surface of sole slipper. The present invention is to be used as a pair of slipper, only the right slipper is shown for clarity. The present invention has cell battery slot and switch. The switch regulates delivery of electrical power to motion piks unit. The switch can be a slider, toggle, or push button or in other means. The switch provides for the wearer to activate the motion to the piks unit. The components are generally located in the heel vicinity, spaced apart and centered in the arch area of the sole. The door generally has the same planar shape as the cell battery. FIG. 3 The present invention insole has four holes to insert the piks unit; the insole layer has a heated system to provide warm massage. The insole layer is removable by the user and able to access the components in the sole. The present invention has upper cover to be affixed to the sole. As in the mentioned description, a toe massage slipper for toes has been described. The motion of the slipper is uniquely capable of soothing and relaxing toes while the operator is on the go, and the piks are removable so the slipper can be used as regular slipper. The toe massage slipper and its various components may be manufactured from many materials, including but not limited to, firm, flexible, bristle cluster, rubber, microfiber, foam, metals, their alloys, and composites. As those skilled in the art will appreciate that the conception, upon which this disclosure is based, may readily be utilized as a basis for the designing of other structures, methods and systems for carrying out the several purposes of the present invention. Therefore, the claims include such equivalent constructions in so far as they do not depart from the spirit and the scope of the present invention.

Figure 1:
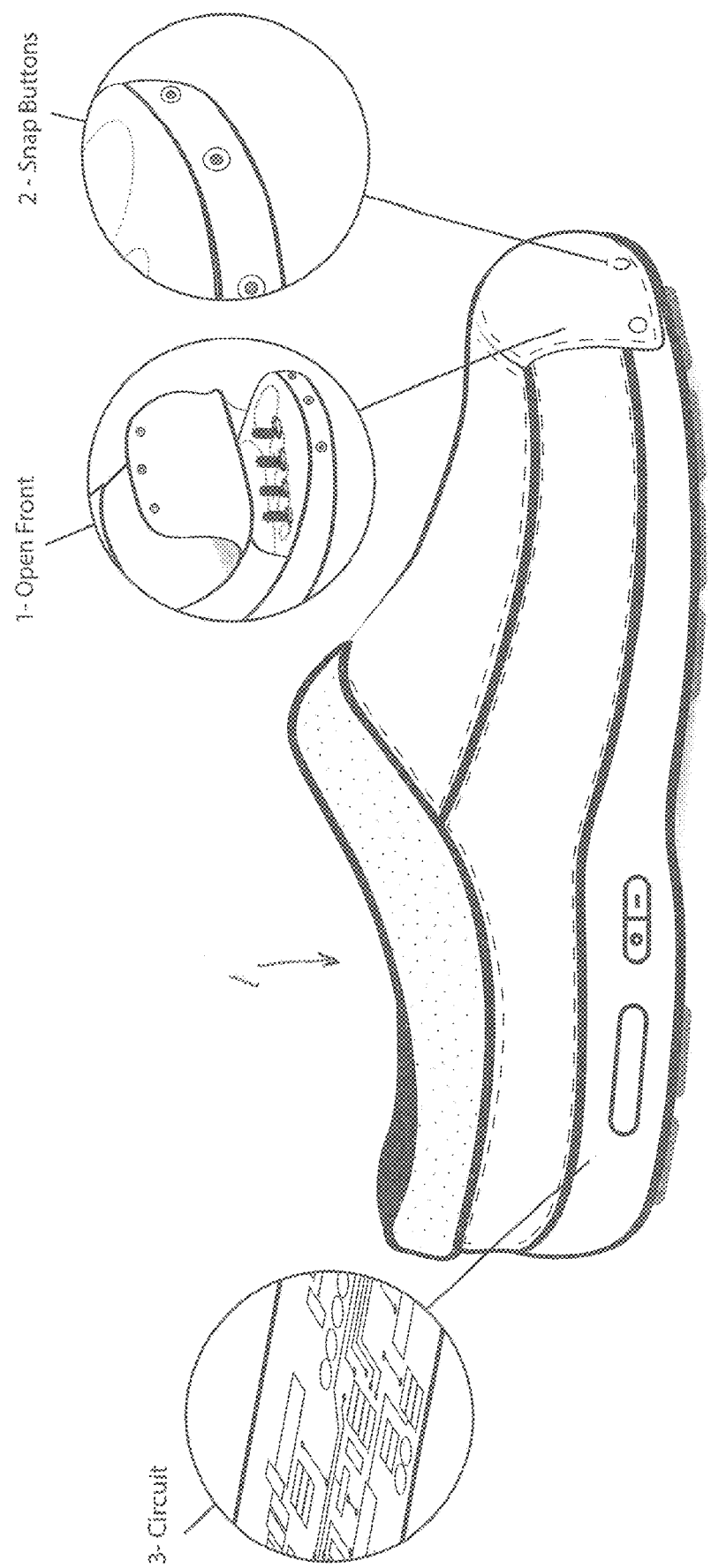
FIG. 1 shows side views of the present invention with three other parts; Zoom view of the following; 1 open front flap access to piks, 2 snap buttons to secure front flap in place, 3-a circuit board area insole.
Figure 2:
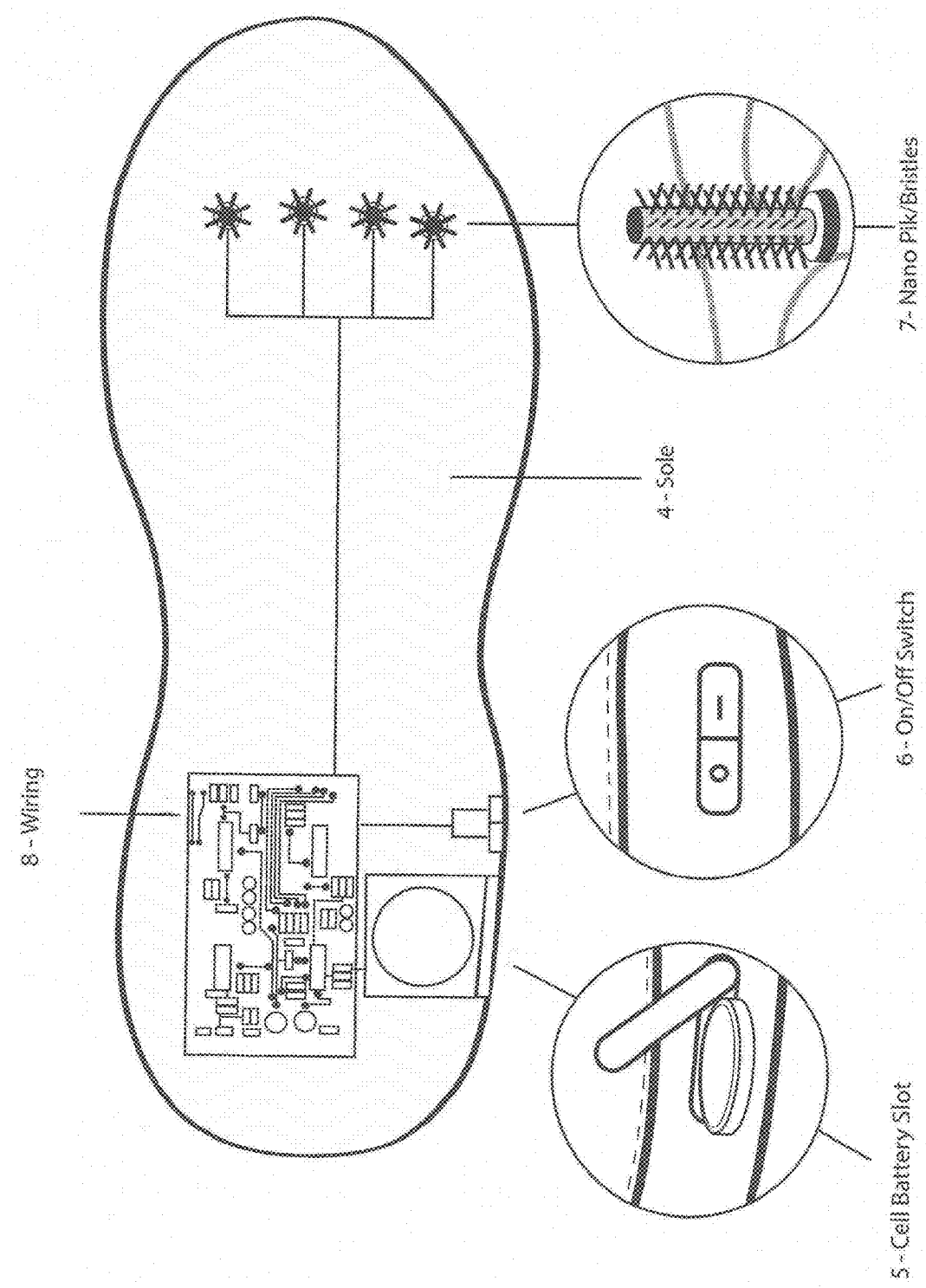
FIG. 2 Shows a perspective view of an embodiment of the bottom portion equipped with a custom sole revealing the circuit board for electrical components wired to transmit power to the piks, shows piks affixed to the front insole of present invention. Zoom view of the following; 4 sole, 5 cell battery slot, 6 on/off switch, 7 piks nano piks/bristles, 8 wiring.
Figure 3:
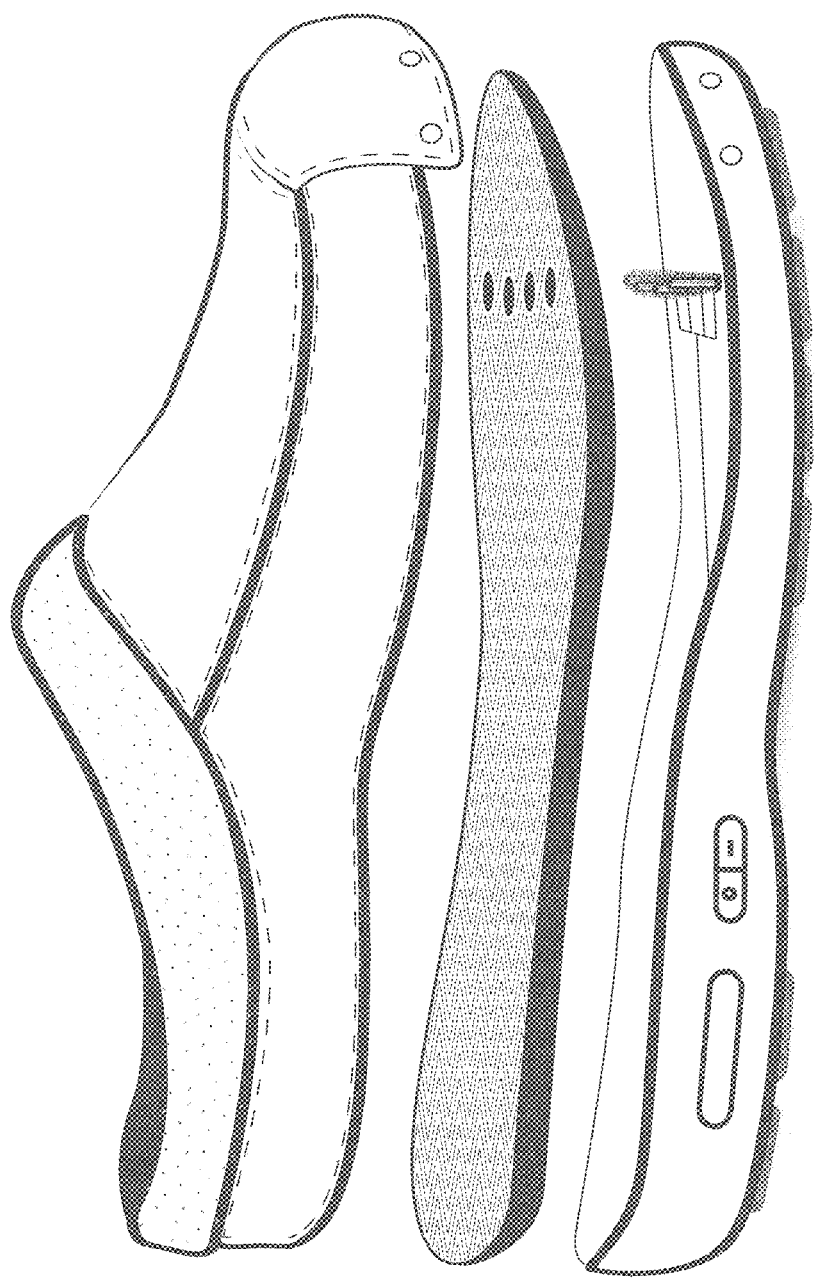
FIG. 3 shows a perspective view of the top portion outer layer, insole layer with heating alternative and custom sole of the present invention. 9 upper layer, 10 insoles, 11 outsoles.
Figure 4:
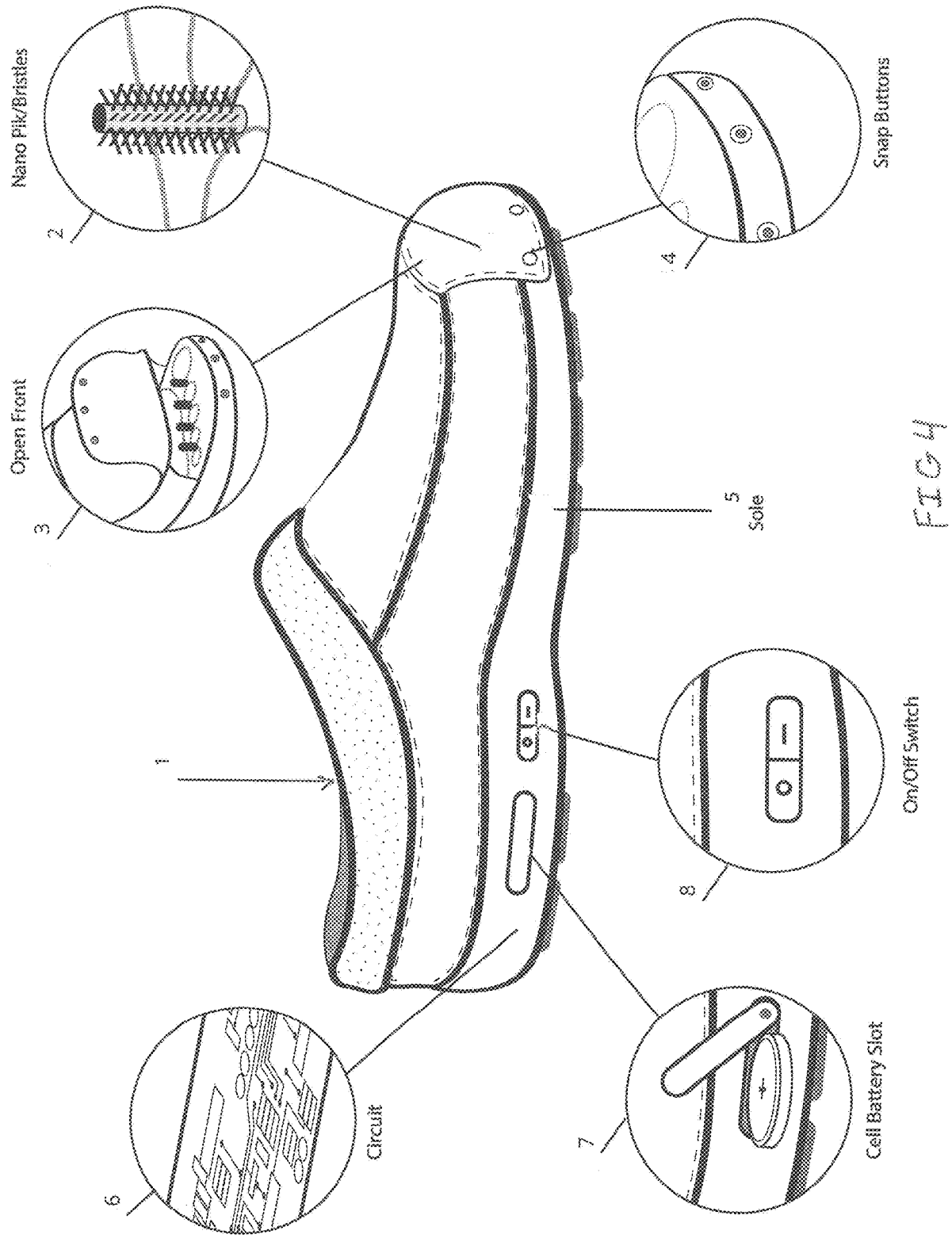
FIG. 4 shows complete overview of the above mentioned figures. The reference numerals refer to the rest of the parts throughout the figures.

I claim:

1. A toe massage slipper, for comforting and relaxing a wearer's toes; said toe massage slipper comprising:
    a custom sole,
    an upper cover,
    said custom sole having
        a plurality of nano piks; wherein said nano piks spin within a front insole;
    wherein said nano piks are removable
        a power source supplying electricity to said nano piks;
    wherein said power source supply is operatively connected to said front slipper to provides power to said nano piks.

2. The toe massage slipper of claim 1, wherein said plurality, of nano piks are made of firm, flexible, foam, microfiber materials with a metal washer located on a bottom of said nano piks; said nano piks are affixed to a front inner sole.

3. The toe massage slipper of claim 2, wherein said custom sole includes a circuit board transmitting power to said nano piks.

4. The toe massage slipper of claim 3, wherein said nano piks can be made in various shapes.

5. The toe massage slipper of claim 4, wherein said nano piks is substantially comprised out of a material selected from the group consisting of: firm, flexible, cluster bristles, rubber, plastic, foam, vinyl, alloys, neoprene, composites.

6. The toe massage slipper of claim 5, wherein a bottom portion of the custom sole is constructed substantially out of a rubber, foam material.

7. The toe massage slipper of claim 6, wherein said power source operates with a three volt lithium cell battery.

8. The toe massage slipper of claim 7, wherein said custom sole and said upper cover are permanently affixed to each other.

9. The toe massage slipper of claim 8, wherein said upper cover comprises a front opening with a flap for providing easy toes access.

10. The toe massage slipper of claim 9, wherein said custom sole includes a cell battery slot and a switch affixed to an external side of said custom sole.

11. The toe massage slipper of claim 1, wherein said custom sole includes an insole layer having a heated system.

\* \* \* \* \*